(12) United States Patent
Chen

(10) Patent No.: US 11,888,011 B2
(45) Date of Patent: Jan. 30, 2024

(54) ELECTRONIC DETECTION MODULE FOR TESTING MICRO CHIPS

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 427 days.

(21) Appl. No.: 16/992,838

(22) Filed: Aug. 13, 2020

(65) Prior Publication Data

US 2021/0050381 A1 Feb. 18, 2021

(30) Foreign Application Priority Data

Aug. 15, 2019 (TW) .................. 108129149

(51) Int. Cl.
*H01L 31/062* (2012.01)
*H01L 31/113* (2006.01)
*H01L 27/146* (2006.01)

(52) U.S. Cl.
CPC .. *H01L 27/14636* (2013.01); *H01L 27/14603* (2013.01)

(58) Field of Classification Search
CPC ......... H01L 27/14636; H01L 27/14603; H01L 27/14643; H01L 27/14665; H01L 27/14687; G01R 3/00
USPC ....................................................... 257/291
See application file for complete search history.

(56) References Cited

U.S. PATENT DOCUMENTS

| | | | | |
|---|---|---|---|---|
| 6,242,746 B1* | 6/2001 | Teranuma | ......... | H01L 27/14676 257/E27.111 |
| 8,493,083 B2* | 7/2013 | Kiyokawa | .......... | G01R 31/2891 324/750.16 |
| 9,812,426 B1* | 11/2017 | Wang | ....................... | H01L 24/19 |
| 9,911,672 B1* | 3/2018 | Wu | ......................... | H01L 21/56 |
| 2002/0018355 A1* | 2/2002 | Johnson | .............. | H01L 27/1021 365/103 |
| 2003/0190425 A1* | 10/2003 | Lugstein | ................ | G01Q 60/60 427/271 |
| 2005/0139831 A1* | 6/2005 | Koyama | ................ | H01J 31/127 313/497 |
| 2005/0168131 A1* | 8/2005 | DiSanto | ................ | H01J 31/127 313/497 |
| 2007/0052909 A1* | 3/2007 | Chou | ..................... | G02F 1/1339 349/155 |
| 2010/0085625 A1* | 4/2010 | Endisch | ................ | B81B 3/0083 359/290 |
| 2011/0049591 A1* | 3/2011 | Nakatani | ........... | H01L 27/14647 257/E31.127 |
| 2011/0304008 A1* | 12/2011 | Yang | ....................... | H01L 24/11 257/737 |

(Continued)

*Primary Examiner* — Ismail A Muse
(74) *Attorney, Agent, or Firm* — Muncy, Geissler, Olds & Lowe, P.C.

(57) ABSTRACT

An electronic detection interface comprises a substrate structure and a plurality of detection units in array. The substrate structure includes a circuit film, which comprises a plurality of circuit units in array. The detection units are disposed on a surface of the substrate structure, and are corresponded to the circuit units in a respect manner. Each of the detection units includes at least one resilient conductive pillar, which is electrically connected to each of the circuit units.

8 Claims, 12 Drawing Sheets

(56) References Cited

U.S. PATENT DOCUMENTS

| | | | | |
|---|---|---|---|---|
| 2012/0304776 A1* | 12/2012 | Novotny | ............... | H01J 31/127 |
| | | | | 313/497 |
| 2013/0112883 A1* | 5/2013 | Aida | ..................... | G01T 1/2006 |
| | | | | 250/362 |
| 2013/0265073 A1* | 10/2013 | Nakano | ..................... | G01R 3/00 |
| | | | | 29/831 |
| 2014/0334601 A1* | 11/2014 | Shizukuishi | ...... | H01L 27/14612 |
| | | | | 257/435 |
| 2016/0088253 A1* | 3/2016 | Tezuka | .............. | H01L 27/14612 |
| | | | | 257/435 |
| 2016/0190198 A1* | 6/2016 | Kwon | ............... | H01L 27/14612 |
| | | | | 257/435 |
| 2017/0186798 A1* | 6/2017 | Yang | ................. | H01L 27/14632 |
| 2017/0309667 A1* | 10/2017 | Yamashita | ........ | H01L 27/14643 |
| 2018/0025986 A1* | 1/2018 | Chiu | ....................... | H01L 23/66 |
| | | | | 257/531 |
| 2018/0211618 A1* | 7/2018 | Wang | ................ | H01L 27/14643 |
| 2018/0366496 A1* | 12/2018 | Li | ......................... | H10K 59/122 |
| 2019/0276308 A1* | 9/2019 | Hsu | ..................... | B81C 1/00349 |
| 2020/0098692 A1* | 3/2020 | Liff | ..................... | H01L 23/5386 |
| 2020/0161229 A1* | 5/2020 | Gandhi | ............. | H01L 23/49811 |

\* cited by examiner

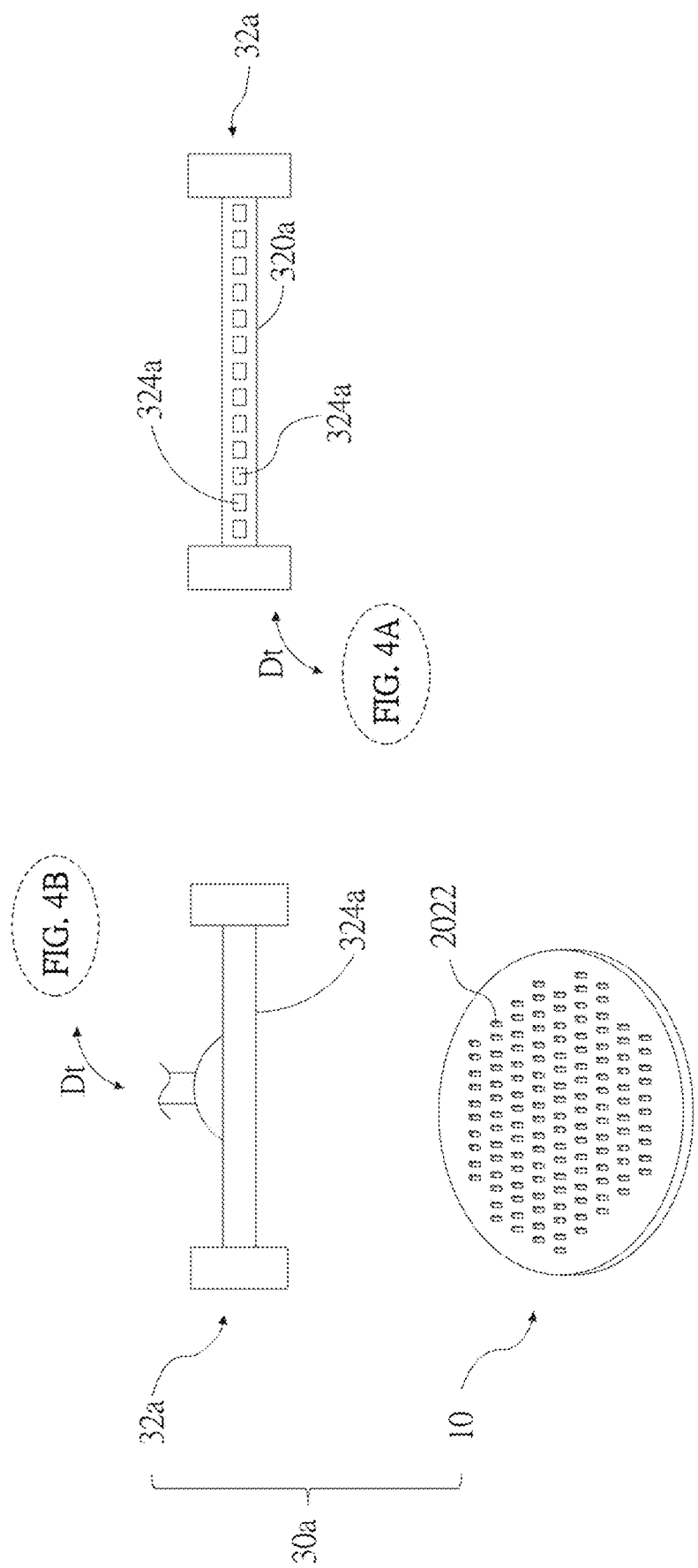

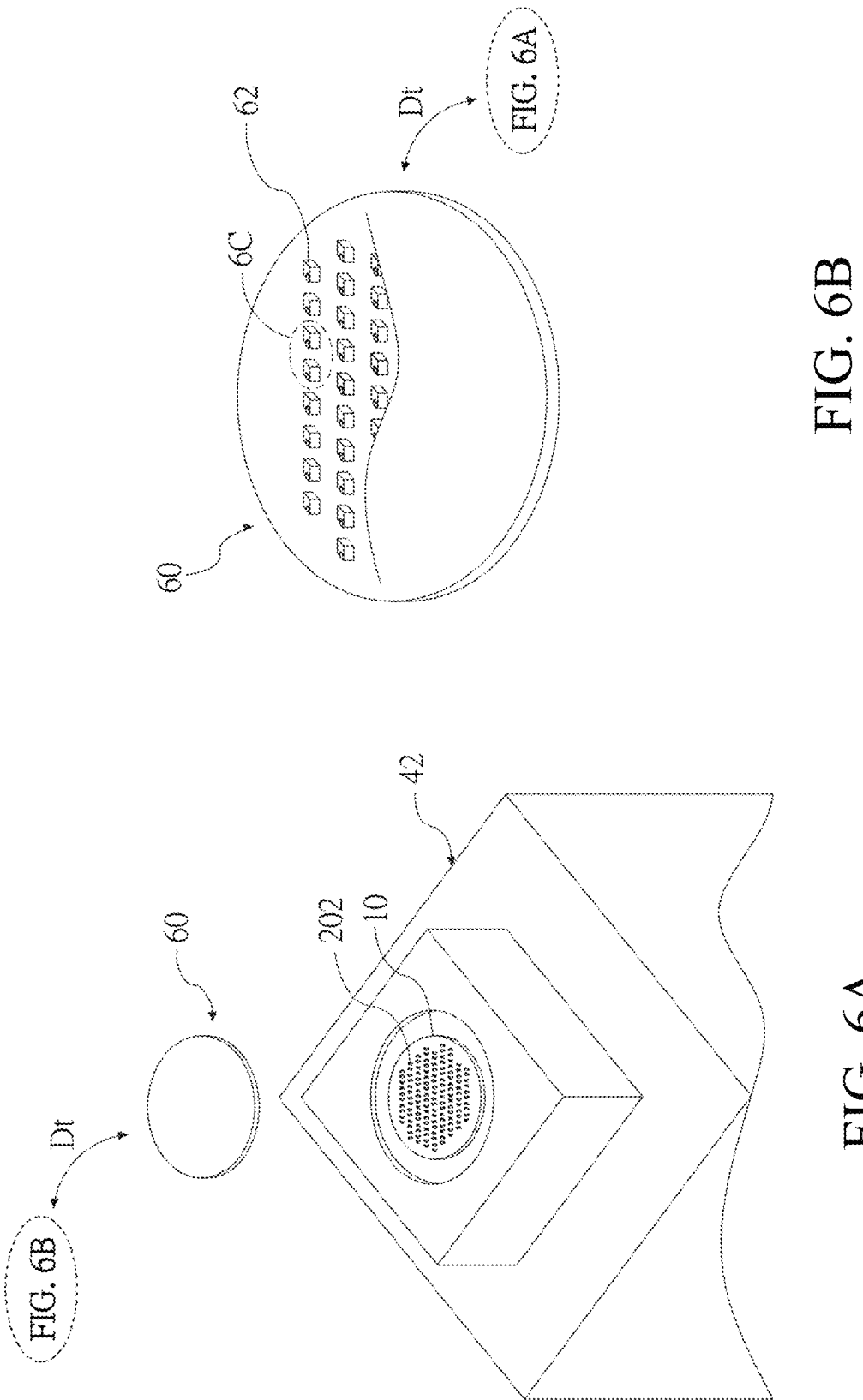

ELECTRONIC DETECTION MODULE FOR TESTING MICRO CHIPS

CROSS REFERENCE TO RELATED APPLICATIONS

This Non-provisional application claims priority under 35 U.S.C. § 119(a) on Patent Application No(s). 108129149 filed in Taiwan, Republic of China on Aug. 15, 2019, the entire contents of which are hereby incorporated by reference.

BACKGROUND

Technology Field

The present disclosure relates to an electronic detection interface and an electronic detection module using the same. In particular, the present disclosure relates to an electronic detection interface and an electronic detection module using the same that are suitable for sorting the electronic devices with micron level or smaller electrodes.

Description of Related Art

The probe card is applied to the integrated circuit (IC) products before the cutting or packaging process. The probe of the probe card can perform the functional test for the chips on the wafer. Specifically, the probe card is a detection fixture provided for testing wafers of different designs, and the probe card includes test pins made of special alloys. In practice, the probe card is installed and electrically connected to a testing/function analysis device. Then, the wafer is moved onto the probe card, so that the test pins protrude and contact the chips of the wafer for testing the chips. An electrical path is formed between the chips, the testing device and the wafer to-be-tested, thereby allowing the testing device to apply currents to the chips of the wafer one-by-one for testing the chips individually. The position and characteristic data of each chip are recorded. Afterwards, the test device can further sort the tested chips based on various characteristics or reject defective products, and the packaging process can be followed. The IC technology has developed to the VLSI (Very Large Integrated Integration), ULSI (Ultra Large Scale Integration), and even GLSI (Giga Scale Integration), but the size reduction of the test pins cannot match the high-density developed integrated circuits due to the technical obstacles such as alloy materials and process accuracy. In general, the probe card is powered and detected the chips on the wafer one by one. Although the miniaturization technology of the test pins is improved, only five to ten pairs of test pins can be used for detecting corresponding number of chips at the same time, which is obviously not enough to cope with the development of high-density integrated circuits.

In addition, the Micro LED (μLED) used in the display technology is too small to be detected with the electrical properties, and cannot be performed with the functional test before transferring the array to the TFT substrate (hereinafter referred to as "detection before TFT substrate"). In other words, each pixel containing the μLED can be detected to obtain the characteristic data after transferring the array to the TFT substrate (hereinafter referred to as "detection after TFT substrate"). However, when the μLED appears as a single device, the requirements for wavelength and brightness control thereof are not so critical. However, due to the sensitivity of human eyes to color, wavelength and brightness, when viewing the μLED array, the un-sorted μLEDs can easy cause the defect such as unevenness, which further affects the visual effect. Therefore, it is very often to find display defects in the case of detection after TFT substrate, but it is difficult to judge whether the defects are caused by the μLED or its corresponding thin-film circuit. Moreover, with the development of nanotechnology and high-density display technology, the number of the nano-LED chips is expected to increase significantly, and it is more difficult to eliminate defects detected in the case of detection after TFT substrate.

SUMMARY

An objective of this disclosure is to provide an electronic detection interface, an electronic detection module and an electronic detection method that can perform rapid product test in a large scale and detect the defects.

To achieve the above, this disclosure provides an electronic detection interface, which comprises a substrate structure and a plurality of detection units in array. The substrate structure includes a circuit film, which comprises a plurality of circuit units in array. The detection units are disposed on a surface of the substrate structure, and are corresponded to the circuit units in a respect manner. Each of the detection units includes at least one resilient conductive pillar, which is electrically connected to each circuit unit.

In some embodiments, the substrate structure comprises a glass substrate.

In some embodiment, the circuit film of the substrate structure comprises an active thin-film-transistor matrix.

In some embodiment, each of the resilient conductive pillars is a conductive photoresist.

In some embodiment, each of the resilient conductive pillars comprises a non-conductive photoresist and a conductive layer covering the non-conductive photoresist.

In some embodiment, a height of each of the resilient conductive pillars is 1-20 μm.

In some embodiment, the height of each of the resilient conductive pillars is 1-10 μm.

In some embodiment, each of the resilient conductive pillars has a contact surface, and a width or a diameter of the contact surface is 0.1-20 μm.

In some embodiment, the width or the diameter of the contact surface is 0.1-8 μm.

To achieve the above, this disclosure also provides an electronic detection module, which is electrically connected to a function analysis device. The electronic detection module comprises an electronic detection interface and a plurality of image detecting units in array. The image detecting units in array are disposed away from the electronic detection interface with a predetermined distance. The image detecting units are corresponded to the detection units of the electronic detection interface in a respect manner, and each of the image detecting units captures at least one image parameter from the corresponding one of the detection units and transmits the captured image parameter to the function analysis device.

To achieve the above, this disclosure also provides an electronic detection module, which is electrically connected to a function analysis device. The electronic detection module comprises an electronic detection interface and a plurality of image detecting units in a row. The image detecting units in a row are disposed away from the electronic detection interface with a predetermined distance. The row of the image detecting units are corresponded to one row of the detection units of the electronic detection interface, and each of the row of the image detecting units captures at least one image parameter from the corresponding detection unit in the corresponding row and transmits the captured image parameter to the function analysis device.

To achieve the above, this disclosure further provides an electronic detection method, which comprises the steps of: preparing an electronic detection interface; providing a to-be-tested wafer, which is configured with a plurality of micro semiconductor chips in array, wherein each micro semiconductor chip comprises at least one electrode; flipping the wafer on the electronic detection interface so that the micro semiconductor chips of the wafer are corresponded to the detection units of the electronic detection interface in a respect manner, wherein a part or all of the micro semiconductor chips are preselected as a detection base; and gradually attaching the wafer to the electronic detection interface until the at least one electrode of each of the micro semiconductor chips preselected as the detection base is slightly contacted or compressed against the at least one resilient conductive pillar of the corresponding one of the detection units so as to electrically connect to each other; wherein the part or all of the micro semiconductor chips are preselected as the detection base before this step.

In some embodiment, in the step of gradually attaching the wafer to the electronic detection interface, the detection base is at least one row of the micro semiconductor chips.

To achieve the above, the present disclosure further provides an electronic detection method, which comprises the steps of: preparing an electronic detection interface; providing a to-be-tested wafer, which is configured with a plurality of micro photoelectric chips in array, wherein each micro photoelectric chip comprises at least one electrode; flipping the wafer on the electronic detection interface so that the micro photoelectric chips of the wafer are corresponded to the detection units of the electronic detection interface in a respect manner; and gradually attaching the wafer to the electronic detection interface until the at least one electrode of each of the micro photoelectric chips, which is preselected as a detection base, is slightly contacted or compressed against the at least one resilient conductive pillar of the corresponding one of the detection units so as to electrically connect to each other, and each of the image detecting units captures the at least one image parameter from the corresponding one of the detection units; wherein the part or all of the micro photoelectric chips are preselected as the detection base before this step; and wherein the at least one image parameter is captured from each of the micro photoelectric chips.

In some embodiment, in the step of gradually attaching the wafer to the electronic detection interface, the detection base is at least one row of the micro photoelectric chips.

In some embodiment, the step of flipping the wafer on the electronic detection interface is to dispose the wafer between the electronic detection interface and the image detecting units.

In some embodiment, in the step of providing the to-be-tested wafer, the wafer comprises a non-transparent substrate; and the step of flipping the wafer on the electronic detection interface is to dispose the wafer and the electronic detection interface at the same surface with respect to the image detecting units.

To achieve the above, the present disclosure further provides an electronic detection method, which comprises the steps of: preparing an electronic detection interface; providing a to-be-tested wafer, which is configured with a plurality of micro photoelectric chips in array, wherein each micro photoelectric chip comprises at least one electrode; flipping the wafer on the electronic detection interface so that the row of image detecting units are corresponded to one row of detection units and the image detecting units in the row are corresponded to the detection units in the row in a respect manner; and gradually attaching the wafer to the electronic detection interface until the at least one electrode of each of the micro photoelectric chips, which is preselected as a detection base, is slightly contacted or compressed against the at least one resilient conductive pillar of the corresponding one of the detection units so as to electrically connect to each other, and each of the image detecting units captures the at least one image parameter from the corresponding one of the detection units; wherein the part or all of the micro photoelectric chips are preselected as the detection base before this step; and wherein the at least one image parameter is captured from each of the micro photoelectric chips.

In some embodiment, in the step of gradually attaching the wafer to the electronic detection interface, the detection base is at least one row of the micro photoelectric chips.

In some embodiment, the step of flipping the wafer on the electronic detection interface is to dispose the wafer between the electronic detection interface and the image detecting units.

In some embodiment, in the step of providing the to-be-tested wafer, the wafer comprises a wafer substrate, the wafer substrate is a base for forming the micro photoelectric chips, the wafer substrate functions as a non-transparent substrate with respect to the lights emitted from the micro photoelectric chips; and the step of flipping the wafer on the electronic detection interface is to dispose the wafer and the electronic detection interface at the same surface with respect to the image detecting units.

As mentioned above, in the electronic detection interface, the electronic detection module and the electronic detection method of this disclosure, a plurality of detection units in array are prepared on the substrate structure, and each detection unit includes at least one resilient conductive pillar. Each resilient conductive pillar can be compressed and deformed. After flipping the wafer on the electronic detection interface, the resilient conductive pillars are corresponded to the micro photoelectric chips or micro semiconductor chips in the respect manner. Then, the wafer and the electronic detection interface are gradually attached, so that a part or all of the resilient conductive pillars are slightly contacted or compressed to deformation, thereby electrically connecting the micro photoelectric chips or micro semiconductor chips to the resilient conductive pillars for following detection. Afterwards, the micro photoelectric chips or micro semiconductor chips can be detected in an array detection or in a row by row detection. Accordingly, the electronic detection interface, the electronic detection module and the electronic detection method of this disclosure can be applied to the high-density developed integrated circuits, and further utilize the image detecting units in a row or an array to detect the high-density developed micro photoelectric chips.

BRIEF DESCRIPTION OF THE DRAWINGS

The disclosure will become more fully understood from the detailed description and accompanying drawings, which are given for illustration only, and thus are not limitative of the present disclosure, and wherein:

FIG. 4A is a partial schematic diagram showing the electronic detection module according to another embodiment of this disclosure;

FIG. 4B is a schematic diagram showing a part of the electronic detection module of FIG. 4A in the opposite viewing angle;

FIG. 6A is a schematic diagram showing the arrangement according to the electronic detection method of FIGS. 5A and 5B;

FIG. 6B is a partial schematic diagram of FIG. 6A in the opposite viewing angle;

DETAILED DESCRIPTION OF THE DISCLOSURE

The present disclosure will be apparent from the following detailed description, which proceeds with reference to the accompanying drawings, wherein the same references relate to the same elements.

An electronic detection interface of this disclosure comprises a substrate structure and a plurality of detection units in array. The substrate structure includes a circuit film, which comprises a plurality of circuit units in array. The detection units are disposed on a surface of the substrate structure, and are corresponded to the circuit units in a respect manner. Each of the detection units includes at least one resilient conductive pillar, which is electrically connected to each circuit unit. Each resilient conductive pillar can be compressed and deformed. When the to-be-tested wafer containing the plurality of micro semiconductor chips or micro photoelectric chips in array is flipped on the electronic detection interface, and the wafer and the electronic detection interface are gradually attached to each other, thereby a part or all of the resilient conductive pillars can be slightly contacted or compressed to deformation. Accordingly, the micro photoelectric chips or micro semiconductor chips can be electrically connected to the resilient conductive pillars for following detection. Afterwards, the micro photoelectric chips or micro semiconductor chips can be detected in an array detection or in a row by row detection. Therefore, the electronic detection interface, the electronic detection module and the electronic detection method of this disclosure can be applied to the high-density developed integrated circuits, and further utilize the image detecting units in a row or an array to detect the high-density developed micro photoelectric chips. The above-mentioned different aspects are all within the scope of the electronic detection interface and the electronic detection module of this disclosure. Different aspects of this disclosure will be described hereinafter.

[Electronic Detection Interface]

Figure 1A:
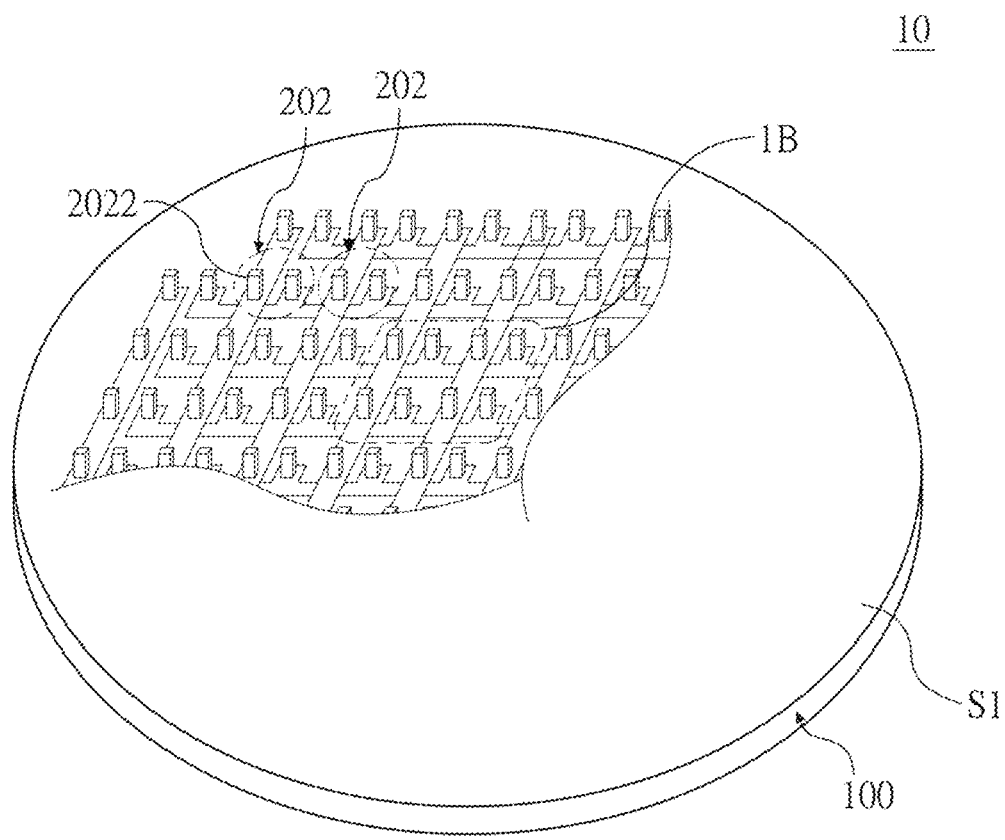
FIG. 1A is a top view of an electronic detection interface according to an embodiment of this disclosure.
Figure 1B:
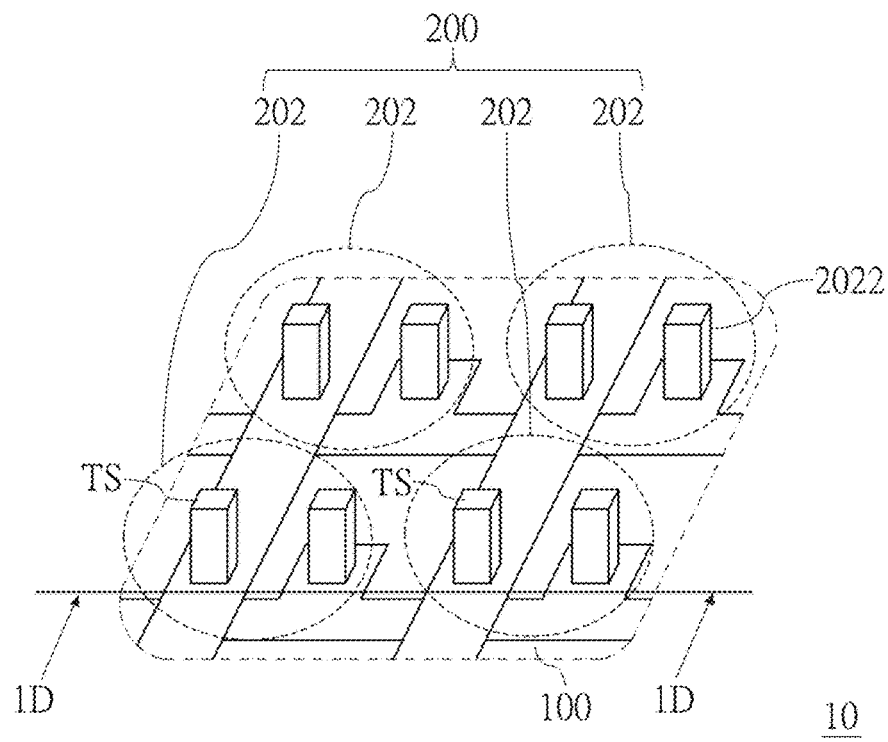
FIG. 1B is a schematic diagram showing a part of FIG. 1A.
Figure 1C:
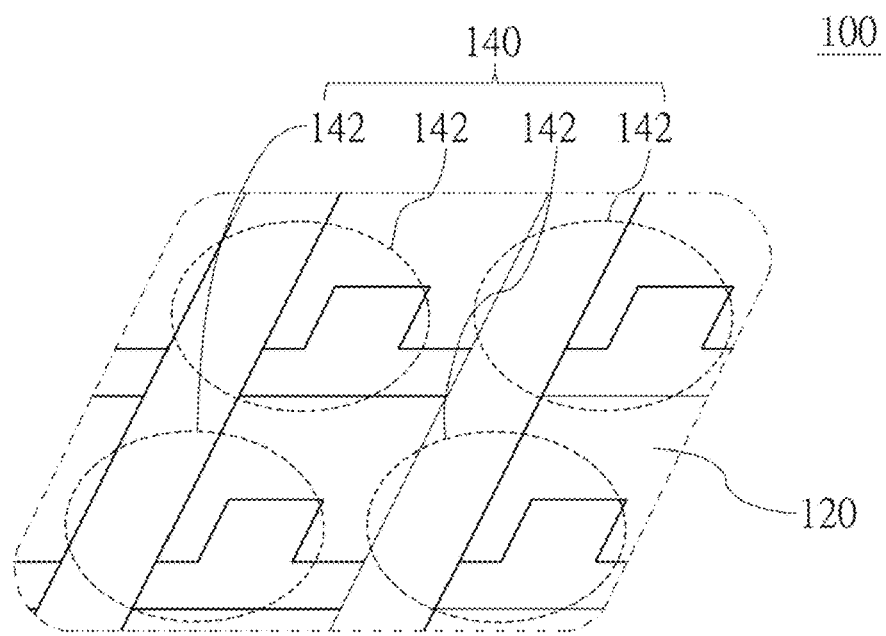
FIG. 1C is a schematic diagram showing a part of the substrate structure 100 of FIG. 1A.
Figure 1D:
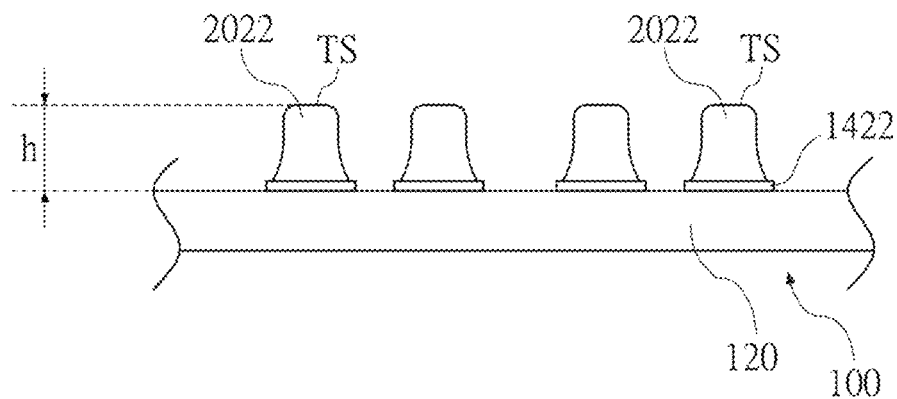
FIG. 1D is a partial sectional view along the line 1D-1D of FIG. 1B.
Figure 1E:
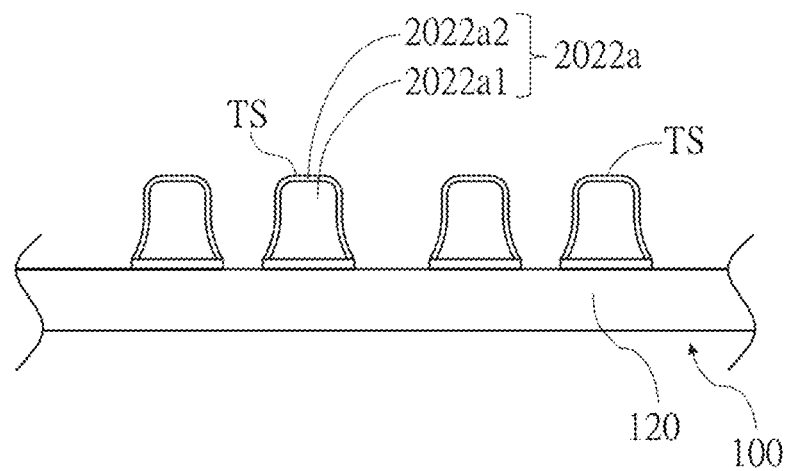
FIG. 1E is a partial section view of an electronic detection interface according to another embodiment of this disclosure.
Figure 1F:
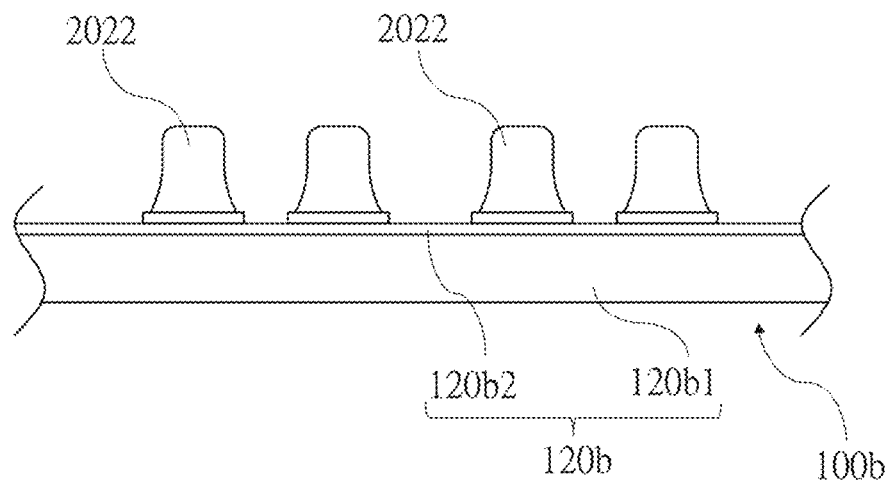
FIG. 1F is a partial section view of an electronic detection interface according to another embodiment of this disclosure.

FIG. 1A is a top view of an electronic detection interface according to an embodiment of this disclosure, FIG. 1B is a schematic diagram showing a part of FIG. 1A, FIG. 1C is a schematic diagram showing a part of the substrate structure 100 of FIG. 1A, FIG. 1D is a partial sectional view along the line 1D-1D of FIG. 1B, and FIGS. 1E and 1F are partial section views of the electronic detection interfaces according to other embodiments of this disclosure.

Referring to FIGS. 1A to 1C, in this embodiment, an electronic detection interface 10 comprises a substrate structure 100 and a plurality of detection units 202 in array. The substrate structure 100 includes a circuit film 140, which comprises a plurality of circuit units 142 in array. The detection units 202 are disposed on a surface S1 of the substrate structure 100. For example, the surface S1 can be the surface of the substrate structure 100 configured with the circuit film 140. The detection units 202 are corresponded to the circuit units 142 in a respect manner. Each of the detection units 202 includes at least one resilient conductive pillar 2022, which is electrically connected to each circuit unit 142. In this embodiment, the amount of the resilient conductive pillars 2022 corresponding to each circuit unit 142 is at least one or is equal to the amount of electrodes in the to-be-tested electronic element. In this embodiment, as shown in FIGS. 1A and 1B, each circuit unit 142 corresponds to a pair of resilient conductive pillars 2022 for detecting the electronic element with one or one pair of electrodes.

Specifically, the electronic detection interface 10 will be further described with reference to FIGS. 1A and 1B. The electronic detection interface 10 comprises a substrate structure 100 and a detection structure layer 200 including a plurality of detection units 202 in array. The substrate structure 100 includes a substrate 120 and a circuit film 140 configured on the substrate 120. The circuit film 140 comprises multiple rows (or multiple columns, or multiple intersected rows and columns) of traces (not labeled), and a plurality of circuit units 142 in array defined on the traces. Each of the detection units 202 includes at least one resilient conductive pillar 2022. The resilient conductive pillars 2022 of the detection units 202 correspond to the circuit units 142 of the circuit film 140 in a respect manner. As shown in FIG. 1C, each circuit unit 142 is defined on one intersection of the traces. Moreover, each circuit unit 142 can be further configured with a conductive pad (not shown) with respect to the corresponding resilient conductive pillar 2022. To be realized, the configuration of the conductive pads can improve the electrical connection between the traces and the resilient conductive pillars 2022 of the detection units 202, and/or define or identify the covering range of the circuit units 142. To be noted, the modifications of the circuit layouts (e.g. the intersections can be electrically in parallel or in series) are predictable, so this disclosure only illustrates that the resilient conductive pillars 2022 are individually electrically connected to the traces. Referring to FIGS. 1A and 1B again, the detection structure layer 200 comprising the detection units 202 in array corresponds to the circuit film 140 comprising the circuit units 142 in array. The detection units 202 are disposed on the surface S1 of the substrate structure 100. In other words, the detection units 202 are disposed on the surface of the substrate 120 configured with the circuit film 140. The detection units 202 as shown in FIG. 1B correspond to the circuit units 142 as shown in FIG. 1C in a respect manner. Each of the detection units 202 is configured with at least one resilient conductive pillar 2022, which is electrically connected to the corresponding circuit unit 142. In this embodiment, as shown in FIGS. 1A and 1B, each detection unit 202 includes a pair of resilient conductive pillars 2022, and the resilient conductive pillars 2022 correspond to the circuit units 142 on the traces, respectively. Specifically, the resilient conductive pillars 2022 of each detection unit 202 correspond and electrically connect to the circuit units 142 on the row and column of the traces, respectively.

In this embodiment, the substrate 120 of the substrate structure 100 can be a glass substrate, and the circuitry of the circuit film 140 formed on the glass substrate can be a passive matrix (PM), which is formed by a thin-film process. To be noted, other processes, which have the cost equal to or lower than the thin-film process, can be used to replace the thin-film process. In addition, the selection of substrate 120 is not limited. For example, the substrate 120 can also be a silicon wafer substrate. That is, the circuitry of the circuit film 140 can be formed on a glass substrate and comprise an active matrix (AM) including transistors, or the circuitry of the circuit film 140 can be formed on a silicon wafer substrate to form a complementary metal-oxide-semiconductor (CMOS). The above-mentioned substitutions can achieve the same function, simplify the external receiving circuit, so they are still applied to the production even having higher cost than the passive type products.

As shown in FIG. 1D, the resilient conductive pillars 2022 are disposed on the glass substrate 120 of the substrate structure 100. The resilient conductive pillars 2022 are conductive photoresists, which are formed by adding the conductive material into the photoresist. The resilient conductive pillars 2022 can be made of positive or negative photoresist, and this disclosure is not limited. The conductive material comprises high-conductive metals such as copper, silver or alloys, which allows the resilient conductive pillars 2022 to be slightly compressed to deform per se, and to directly or indirectly (through the conductive pads 1422) electrically connect to the circuit film 140. Each resilient conductive pillar 2022 is defined with a height h, and the height h is 1-20 μm, or is 1-10 μm. In this embodiment, the height h is defined by, not limited thereto, the size of the to-be-tested micro semiconductor chip/micro photoelectric chip and the manufacturing precision. The height h is sufficient for meeting the deformation of the resilient conductive pillars 2022 after the slight compression. To be noted, the above-mentioned micro semiconductor chip/micro photoelectric chip comprises not only the case that the chip size is in the micro level (excluding the larger or smaller size, such as the millimeter level or nanometer level), but also the case that the chip size ranges from the millimeter level to the nanometer lever or smaller and the chip has the electrode size in the micro level (e.g. micrometers, tens micrometers, or hundreds micrometers) or smaller (e.g. nanometers, tens nanometers, or hundreds nanometers). That is, the millimeter level chip having micro level electrodes is within the scope of this disclosure.

In addition, the resilient conductive pillars 2022 are manufactured as a preset shape, such as the rectangular pillars, cylindrical pillars, or any of other shapes of pillars (not shown). To be noted, the manufactured resilient conductive pillars 2022 do not need to remain the original profile in the manufacturing process, but keep the pillar shape that can receive the force from the top thereof. The definition of receiving the force from the top includes to receive the vertical force parallel to the axis of the pillar body by the cone tip, convex arc, top surface, or top portion (located at the upper part of the pillar including the cone tip, convex arc, and top surface), or a non-vertical force that is not parallel to the axis of the pillar. The appearance of each resilient conductive pillar 2022 is not limited in this disclosure. In general, the upper portion of each resilient conductive pillar 2022 is formed as a corn tip, but it will become a convex arc or a planar top surface finally. As shown in FIGS. 1B and 1D, each resilient conductive pillar 2022 is further defined with a contact surface TS for contacting to the electrode of the micro semiconductor chip/micro photoelectric chip. The contact surface TS is defined with a width or diameter of 0.1-20 μm, or a width or diameter of 0.1-8 μm. To be understood, the appearance of the contact surface TS can be a planar surface, an arc surface, a corn surface, or any of other shapes that have enough area for contacting to the micro semiconductor chip/micro photoelectric chip, and this disclosure is not limited.

FIGS. 1E and 1F are schematic diagrams showing the substrate structures 100a and 100b of different embodiments. Regarding the substrate structure 100a of FIG. 1E, each resilient conductive pillar 2022a is disposed on the glass substrate 120a of the substrate structure 100a. Specifically, in this embodiment, the non-conductive photoresists 2022a1 in array are arranged on the glass substrate 120a, and then a layer of continuous conductive layer 2022a2 is sputtered on the glass substrate 120a for entirely covering each of the non-conductive photoresists 2022a1 in array. The non-conductive photoresists 2022a1 of the resilient conductive pillars 2022a can be slightly compressed to deformation. In another possible aspect, the conductive layer 2022a2 can be a non-continuous layer, and the non-continuous conductive layer 2022a2 can reach the upper portions of the non-conductive photoresists 2022a1 to form the contact surfaces TS of the resilient conductive pillars 2022a and to electrically connect the contact surfaces TS to the circuit film (not shown). In this case, each resilient conductive pillar 2022a comprises a non-conductive photoresist 2022a1 and a conductive layer 2022a2 covering the non-conductive photoresist 2022a1. Regarding the substrate structure 100b of FIG. 1F, the substrate structure 100b comprises a substrate 120b and a circuit film (not shown) formed on the substrate 120b. The substrate 120b comprises a glass substrate 120b1 and a flexible material 120b2 disposed on the glass substrate 120b1. Herein, the circuit film (not shown) can be formed on the flexible material 120b2. In this embodiment, the flexible material 120b2 can be slightly compressed to deformation and thus can be functioned as a buffer material. For example, the flexible material 120b2 can be a PI film, a PET film, or any of other buffer materials.

[Electronic Detection Module]

Figure 2:
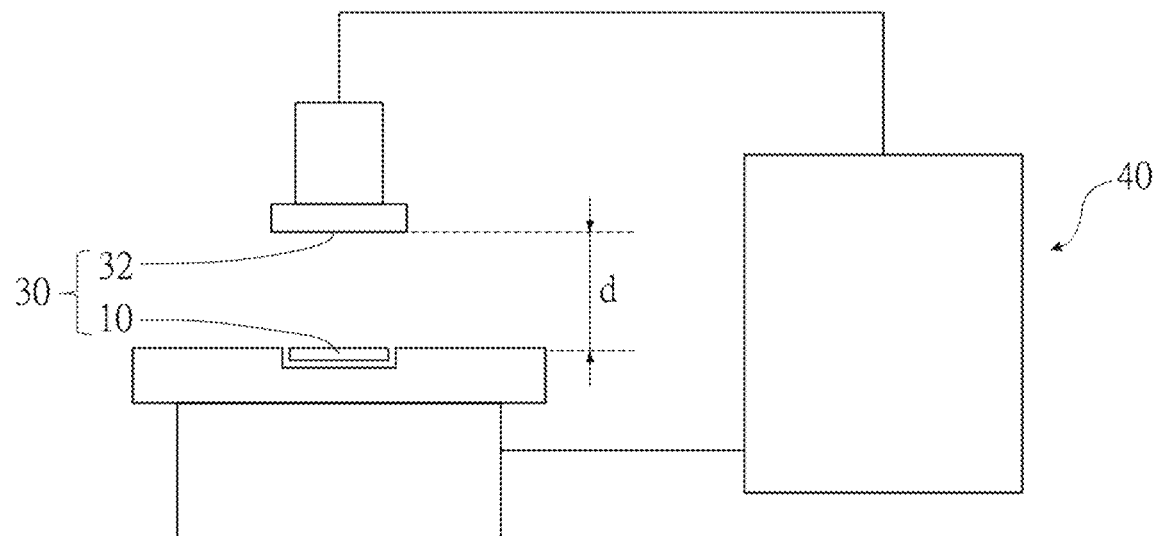
FIG. 2 is a system schematic diagram showing the electronic detection module of this disclosure applied to a function analysis device.
Figure 3B:
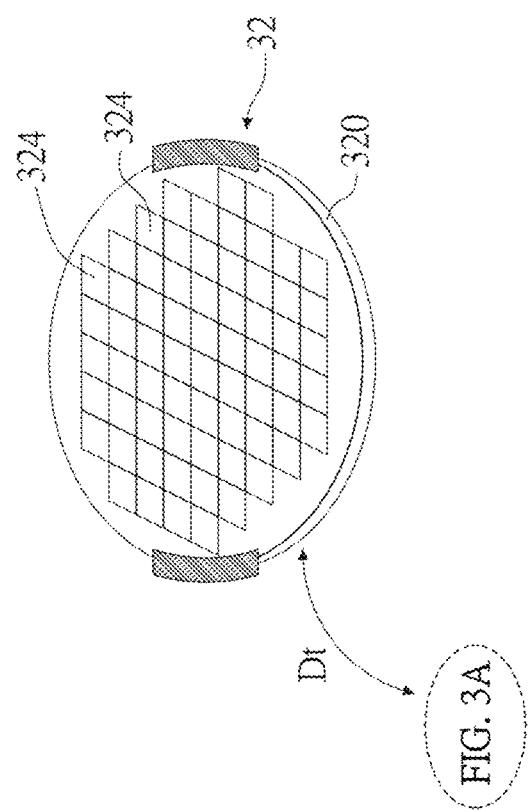
FIG. 3B is a schematic diagram showing a part of the electronic detection module of FIG. 3A in the opposite viewing angle.
Figure 3A:
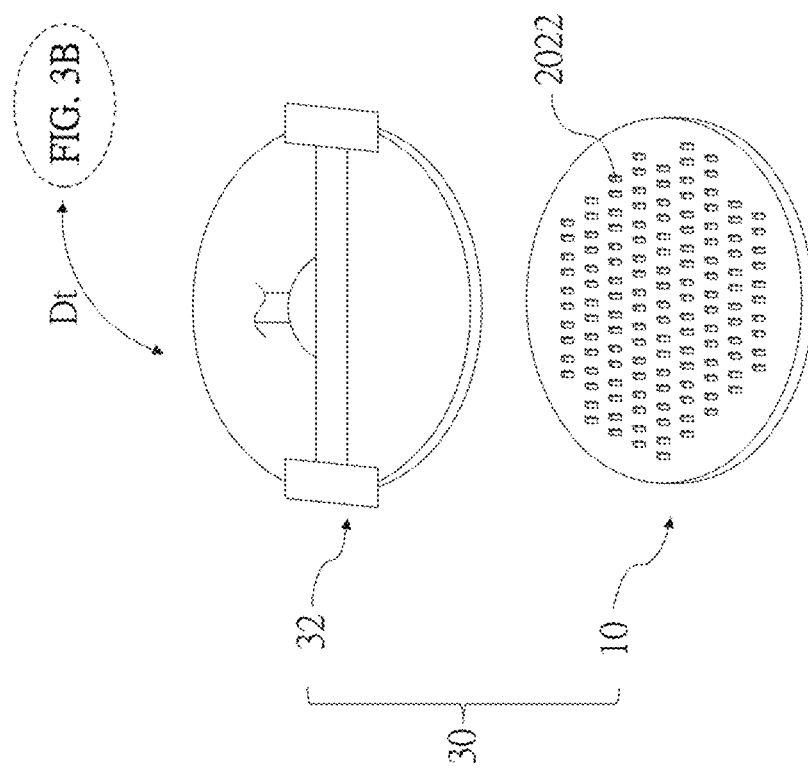
FIG. 3A is a partial schematic diagram of FIG. 2.

FIG. 2 is a system schematic diagram showing the electronic detection module of this disclosure applied to a function analysis device; FIG. 3A is a partial schematic diagram of FIG. 2 showing the electronic detection module only; FIG. 3B is a schematic diagram showing a part of the electronic detection module of FIG. 3A in the opposite viewing angle; FIG. 4A is a partial schematic diagram showing the electronic detection module according to another embodiment of this disclosure; and FIG. 4B is a schematic diagram showing a part of the electronic detection module of FIG. 4A in the opposite viewing angle.

Referring to FIGS. 2, 3A and 3B, an electronic detection module 30 is installed and electrically connected to a function analysis device 40. The electronic detection module 30 comprises any of the electronic detection interface according to different aspects (the electronic detection interface 10 is used in this embodiment), and an image detecting device 32, which comprises a plurality of image detecting units 324 in array. The electronic detection interface 10 and the image detecting units 324 in array are individually installed and electrically connected to the function analysis device 40, and they are separately arranged along a predetermined direction with a predetermined distance d. The image detecting units 324 correspond to the detection units 202 of the electronic detection interface 10 in a respect manner, and each of the image detecting units 324 captures at least one image parameter from the corresponding one of the detection units 202. The type and application of the function analysis device 40 are very broad, and are briefly described, but not limited, in this disclosure. In addition, the image detecting units 324 in array correspond to the detection units 202 in array for capturing the required image parameters, so that this embodiment has the advantage of high detection efficiency.

In this embodiment, FIG. 3B is a schematic diagram showing a part of the electronic detection module of FIG. 3A in the opposite viewing angle along the turnover direction Dt. The image detecting device 32 comprises a substrate structure 320 and a plurality of image detecting units 324 in array, which are formed on the substrate structure 320. Each image detecting unit 324 can be a CCD (Charge-coupled device), a CMOS (Complementary Metal-Oxide-Semiconductor), or any of other photosensitive elements that can capture the image and analyze the light intensity and wavelength. In addition, the image detecting device 32 can further provide the grating light-splitting system, Fourier Transform system, polarizer system, or the likes according to the amount and arrangement of the image detecting units 324, and this disclosure is not limited. Moreover, the image detecting device 32 can not only provide the photosensitive elements for capturing images (and analyzing the light intensity and wavelength), but also offer the function cooperating with the function analysis device 40. For example, the image detecting device 32 can directly transmit the captured at least one image parameter to the function analysis device 40, or the image detecting device 32 can pretreat the captured at least one image parameter and then transmit the pretreated image parameter to the function analysis device 40. This disclosure is not limited. In this disclosure, "to transmit the captured image parameter to the function analysis device" should be understood as "to directly or indirectly transmit the original data or the pretreated data to the function analysis device 40". To be noted, "each of the image detecting units 324 captures at least one image parameter from the corresponding one of the detection units 202" should comprise the image parameters of the detection units 202, the micro photoelectric chips driven by the detection units 202, respectively (to be described hereinafter), or the detection units 202 and the micro photoelectric chips.

FIG. 4A shows the electronic detection module 30a according to another embodiment. The electronic detection module 30a comprises an electronic detection interface 10, and an image detecting device 32a comprising a plurality of image detecting units 324a in a row. The electronic detection interface 10 and the row of image detecting units 324a are individually installed and electrically connected to the function analysis device, and they are also separately disposed. FIG. 4B is a schematic diagram showing a part of the electronic detection module of FIG. 4A in the opposite viewing angle along the turnover direction Dt. The image detecting device 32a comprises a substrate structure 320a and a plurality of image detecting units 324a in a row (single row), which are formed on the substrate structure 320a. The row of image detecting units 324a correspond to one row of the detection units 202 of the electronic detection interface 10 in a respect manner. Each image detecting unit 324a in the row of image detecting units 324a captures at least one image parameter from the corresponding detection unit 202. In this embodiment, the image detecting units 324a in a row can capture the image parameters of only one row of the detection units 202, or capture the image parameters of the array of the detection units 202 row by row (a stepwise manner). In other words, the single row of image detecting units 324a can repeatedly capture different rows of the detection units 202 of the electronic detection interface 10 for obtaining all image parameters. In addition, the configuration of image detecting units in a row has lower cost than the configuration of image detecting units in array. To be noted, "a row of image detecting units 324a" could be comprehended as "a row in an array"; "couple rows of image detecting units 324a" could be comprehended as "an array" or "a tiny array in an array".

Specifically, in the electronic detection module 30, 30a, the electronic detection interface 10 and the image detecting device 32, 32a are preferably separately disposed. However, the surface of the image detecting device 32, 32a facing the electronic detection interface 10 and configured with the detection units 202 or the opposite surface thereof can be determined based on the amount and aspect of the to-be-tested micro photoelectric chips or the manufacturing conditions, and this disclosure is not limited. In this disclosure, the image detecting device 32, 32a is enough to capture the image parameters of the to-be-tested micro photoelectric chips.

[Electronic Detection Method]

Figure 5A:
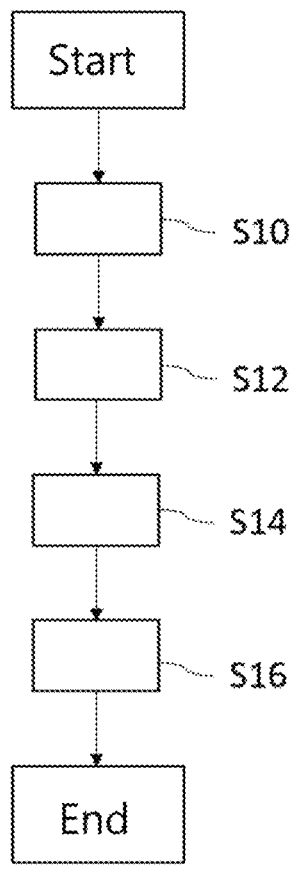
FIGS. 5A and 5B are flow charts of the electronic detection method for detecting micro semiconductor chips according to different embodiments of this disclosure.
Figure 5B:
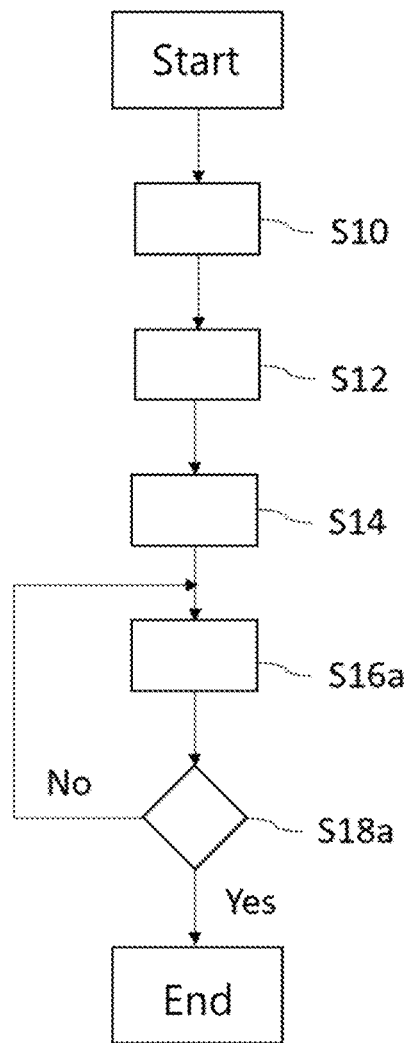
Figure 6C:
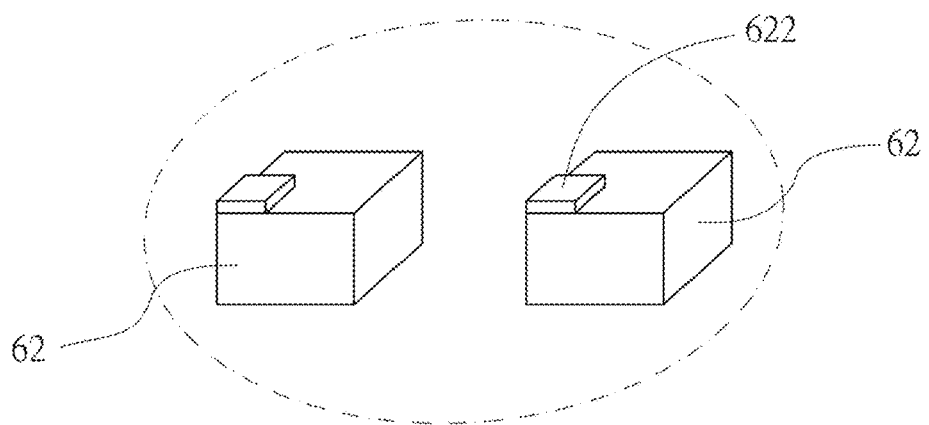
FIG. 6C is a partial schematic diagram of FIG. 6B.

FIGS. 5A and 5B are flow charts of the electronic detection method for detecting micro semiconductor chips according to different embodiments of this disclosure; and FIGS. 6A to 6C are schematic diagrams showing the arrangement according to the electronic detection method.

Referring to FIG. 5A, the electronic detection method of this embodiment comprises the steps S10~S16, which will be described hereinafter with reference to FIG. 6A.

The step S10 is to prepare an electronic detection interface as mentioned above (e.g. the electronic detection interface 10 in this embodiment). As shown in FIG. 6A, the electronic detection interface 10 is installed and electrically connected to a function analysis device 40.

The step S12 is to provide a to-be-tested wafer 60. FIG. 6B is a partial schematic diagram of FIG. 6A in the opposite viewing angle along the turnover direction Dt. The wafer 60 is configured with a plurality of micro semiconductor chips 62 in array, and each micro semiconductor chip 62 comprises at least one electrode 622. FIG. 6C shows that each micro semiconductor chip 62 comprises a single electrode 622.

The step S14 is to flip the wafer 60 on the electronic detection interface 10 so that the micro semiconductor chips 62 of the wafer 60 are corresponded to the detection units 202 of the electronic detection interface 10 in a respect manner as shown in FIG. 6A.

The step S16 is to gradually attach the wafer 60 to the electronic detection interface 10 until at least one electrode 622 of each of the micro semiconductor chips 62 selected as the detection base is slightly contacted or compressed against at least one resilient conductive pillar 2022 of the corresponding one of the detection units 202 so as to electrically connect to each other. Herein, a part or all of the micro semiconductor chips 62 are preselected as the detection base before the step S16.

Specifically, in the step S10, the electronic detection interface 10 is installed on a working stage 42 of the function analysis device 40 and is electrically connected to the function analysis device 40. In addition, a part or all of the micro semiconductor chips 62 of the wafer 60 can be preselected as the detection base in the step S12, the step S14, or the step S16. The detection base is the base for performing the total detection or the partial detection of the micro semiconductor chips 62 disposed on the wafer 60 according to the actual requirement. For example, the detection base can be at least one row of the micro semiconductor chips 62. Furthermore, it is possible to detect the micro semiconductor chips 62 preselected as the detection base optionally by detection at once or by multiple detections. For example, the electronic detection interface 10 can be powered on in in array or be powered on row by row.

In this disclosure, the micro semiconductor chips 62 comprise the micro semiconductor structures other than the micro photoelectric chips that can emit light (including visible and/or invisible light). After electrically connecting the wafer 60 and the electronic detection interface 10, it is possible to operate the function analysis device (not shown) to obtain at least one electrical parameter of the micro semiconductor chips 62 selected as the detection base of the wafer 60. In this embodiment, the wafer 60 containing the micro semiconductor chips 62 can further cooperate with an image detecting device (not shown) for capturing the image parameter(s) of one micro semiconductor chip 62, each of the micro semiconductor chips 62, or the entire wafer 60, thereby feeding back the information such as the wafer alignment or other defects.

In the step S16, the wafer 60 corresponds to the electronic detection interface 10, and the (one or more) electrodes 622 of the micro semiconductor chips 62 within the to-be-tested base correspond to the resilient conductive pillars 2022 of the detection units 202 in a respect manner. As shown in FIG. 6C, each micro semiconductor chip 62 includes a single electrode 622, so each detection unit 202 can be configured with a single resilient conductive pillar 2022 for corresponding to the single electrode 622. Alternatively, each micro semiconductor chip 62 may include a pair of electrodes 622, and one of the resilient conductive pillars 2022 corresponds to the single electrode 622 of the corresponding micro semiconductor chip 62. To be noted, the micro semiconductor chips 62 must correspond to the detection units 202 in a respect manner for implementing the above electrical connection. The wafer 60 and the electronic detection interface 10 are gradually attached to each other until the electrode 622 of each micro semiconductor chip 62 preselected as the detection base is electrically connected to the resilient conductive pillar 2022 of the corresponding detection unit 202 so as to electrically connect to each other (the respect manner). Herein, the electrode 622 can be slightly contacted or compressed against the resilient conductive pillar 2022 to deformation so as to electrically connect to each other. Accordingly, when the entire wafer 60 is slightly curved, or the heights of the micro semiconductor chips 62 or the electrodes 622 of the micro semiconductor chips 62 are varied caused by the process precision, the chip tilting, or the curved wafer, the resilient conductive pillars 2022 can provide the deformable property caused by slight compression for obtaining the buffer function. This configuration can prevent the short circuit of the resilient conductive pillars 2022 caused by the tilting or breaking of the structure, so that all of the micro semiconductor chips 62 within the to-be-tested base can be electrically connected to the corresponding resilient conductive pillars 2022. To be noted, the substrate structure of the electronic detection interface 10 can be further configured with the flexible substrate as mentioned above for further improving the buffer effect. In addition, the step of gradually attaching can be carried out by moving either one or both of the wafer 60 and the electronic detection interface 10, thereby gradually decreasing the distance therebetween.

Referring to FIG. 5B, when a part of the micro semiconductor chips 62 of the wafer 60 are preselected as the detection base, the unselected part of the micro semiconductor chips 62 of the wafer 60 can also be tested additionally. In addition, the micro semiconductor chips 62 within the preselected detection base can be further optionally detected row by row. Different from the embodiment of FIG. 5A, the step S16a of FIG. 5B preselects a part of the micro semiconductor chips 62 as the detection base, and an additional step S18a is performed after the step S16a. The step S18a is to determine whether the detection procedure ends or not. If not, the detection procedure returns to the step S16a to select the residual part of the micro semiconductor chips 62 as the detection base to optionally perform a single detection or multiple detection.

Figure 7:
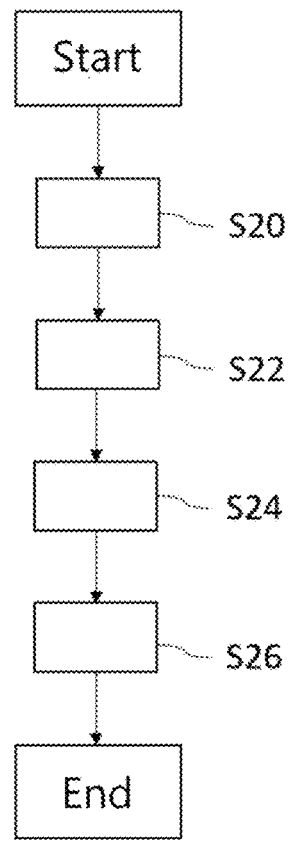
FIG. 7 is a flow chart of the electronic detection method for detecting micro photoelectric chips with the electronic detection module according to an embodiment of this disclosure.
Figures 8A, 8B:
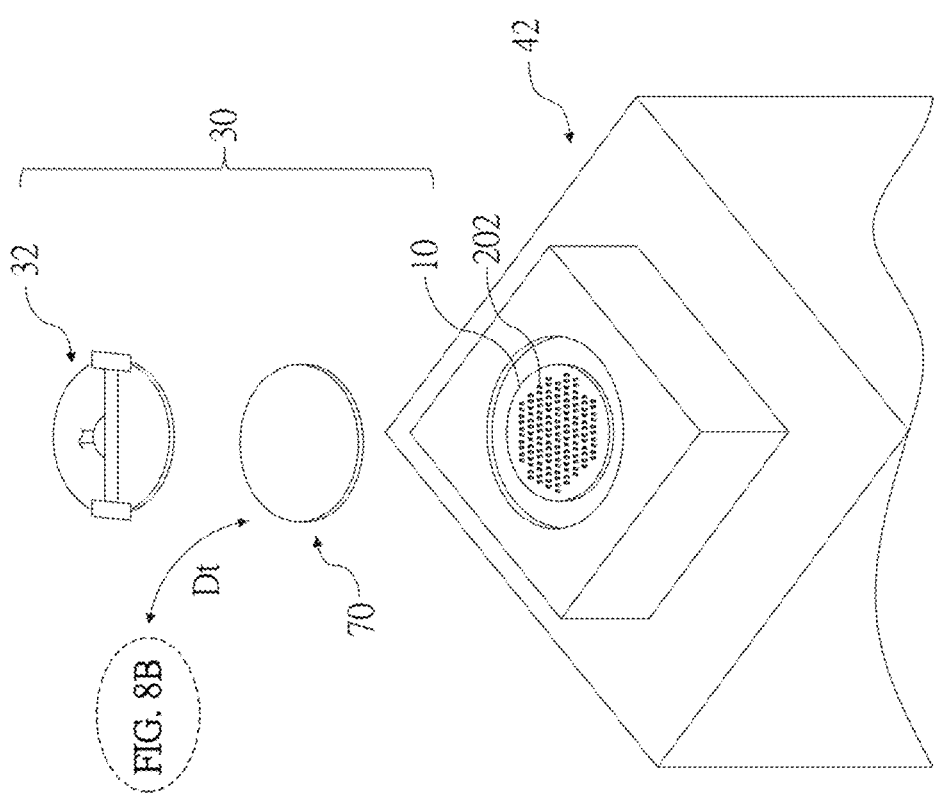
FIG. 8A is a schematic diagram showing the arrangement according to the electronic detection method of FIG. 7.
FIG. 8B is a partial schematic diagram of FIG. 8A in the opposite viewing angle.
Figure 8C:
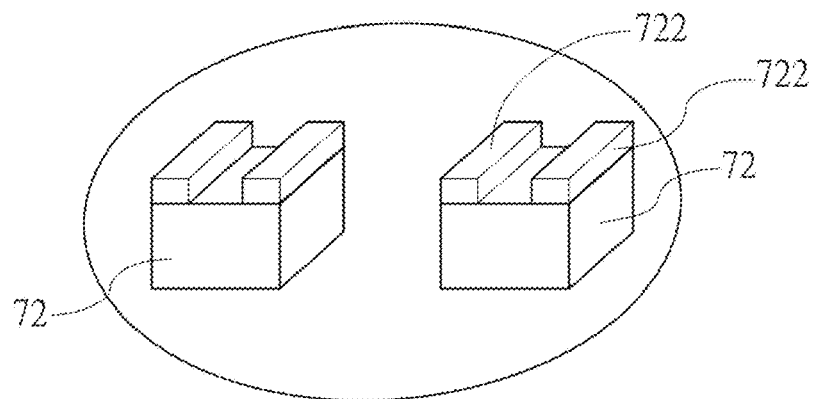
FIG. 8C is a partial schematic diagram of FIG. 8B.

FIG. 7 is a flow chart of the electronic detection method for detecting micro photoelectric chips with the electronic detection module according to an embodiment of this disclosure; and FIGS. 8A to 8C are schematic diagrams showing the arrangement according to the electronic detection method of FIG. 7.

Referring to FIG. 7, the electronic detection method of this embodiment comprises the steps S20~S26, which will be described hereinafter with reference to FIG. 8A.

The step S20 is to prepare an electronic detection module 30. As shown in FIG. 8A, the electronic detection module 30 comprises any of the above-mentioned electronic detection interfaces (e.g. the electronic detection interface 10 in this embodiment), and an image detecting device 32 comprising a plurality of image detecting units 324 in array as shown in FIG. 3B. The electronic detection module 30 is installed and electrically connected to a function analysis device 40.

The step S22 is to provide a to-be-tested wafer 70. FIG. 8B is a partial schematic diagram of FIG. 8A in the opposite viewing angle along the turnover direction Dt. The wafer 70 is configured with a plurality of micro photoelectric chips 72 in array, and each micro photoelectric chip 72 comprises at least one electrode 722.

The step S24 is to flip the wafer 70 on the electronic detection interface 10, so that the micro photoelectric chips 72 of the wafer 70 are corresponded to the detection units 202 of the electronic detection interface 10 of the electronic detection module 30 in a respect manner.

The step S26 is to gradually attach the wafer 70 to the electronic detection interface 10 of the electronic detection module 30 until at least one electrode 722 of each of the micro semiconductor chips 72 selected as the detection base is slightly contacted or compressed against at least one resilient conductive pillar 2022 of the corresponding one of the detection units 202 so as to electrically connect to each other. At the same time, each of the image detecting units 324 of the electronic detection module 30 captures the at least one image parameter from the corresponding one of the detection units 202 of the electronic detection interface 10. Herein, a part or all of the micro photoelectric chips 72 are preselected as the detection base before the step S26, and the at least one image parameter is captured from each of the micro photoelectric chips 72.

Most of this embodiment and various modified aspects thereof can be referred to the above embodiments and aspects. Different from the above embodiments and aspects, in this embodiment as shown in FIGS. 8A to 8C, the wafer 70 comprises a plurality of micro photoelectric chips 72 capable of emitting light (including visible and/or invisible light), and the electronic detection module 30 has the photo detection function for detecting the micro photoelectric chips 72. In addition, as shown in FIGS. 8B and 8C, the micro photoelectric chip 72 comprises two electrodes 722, which can correspond to the pair of resilient conductive pillars 2022 of the corresponding detection unit 202. To be noted, the micro photoelectric chips 72 must correspond to the detection units 202 in a respect manner for implementing the above electrical connection. In this embodiment, a part of the micro photoelectric chips 72 of the wafer 70 can be preselected as the detection base. For example, at least one row of the micro photoelectric chips 72 can be preselected as the detection base, and the judgement step in the flow chart of FIG. 5B can also be applied. The detailed description thereof will be omitted in this embodiment.

To be noted, the light emitted from the micro photoelectric chips 72 may penetrate through the wafer substrate. For example, when the micro photoelectric chip 72 is a blue μLED chip and the substrate of the micro photoelectric chip 72 is a sapphire substrate ($Al_2O_3$), the blue light (visible light) emitted from the blue μLED chip can penetrate through the sapphire substrate (function as a light-permeable substrate). In addition, when the micro photoelectric chip 72 is an IR μLED chip and the substrate of the micro photoelectric chip 72 is a silicon substrate, the IR light (invisible light) emitted from the IR μLED chip can penetrate through the silicon substrate (function as a light-permeable substrate). In the step S22 or S24, the wafer 70 can be disposed between the electronic detection interface 10 and the image detecting units 324, or the wafer 70 and the electronic detection interface 10 can be disposed at the same surface with respect to the image detecting units 324, and this disclosure is not limited thereto only if the image detecting device 32 can capture the image parameter of the to be detected micro photoelectric chip 72. Alternatively, the light emitted from the micro photoelectric chips 72 may not penetrate through the wafer substrate. For example, when the micro photoelectric chip 72 is a red μLED chip and the substrate of the micro photoelectric chip 72 is a GaAs substrate, the red light (visible light) emitted from the red μLED chip cannot penetrate through the GaAs substrate (function as a nontransparent substrate). In the step S22 or S24, the wafer 70 is preferably disposed between the electronic detection interface 10 and the image detecting units 324, so that the image detecting device 32 can capture the image parameter of the to be detected micro photoelectric chip 72.

The image parameter of the micro photoelectric chip 72 comprises the light intensity (including the lighting element, non-lighting element, visible light, or invisible light) and wavelength for identifying the brightness and chroma of the micro photoelectric chip 72.

Figure 9:
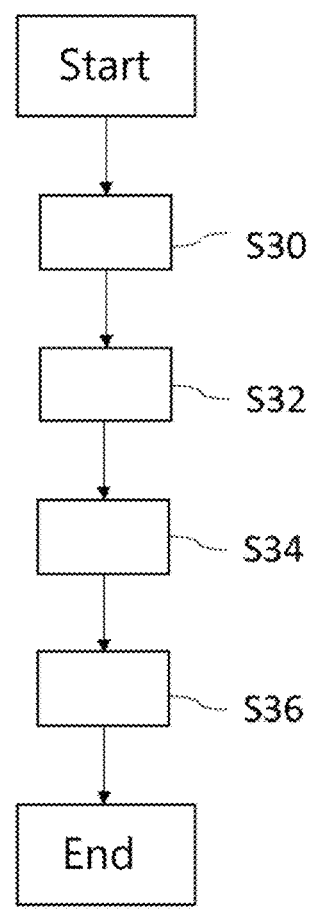
FIG. 9 is a flow chart of the electronic detection method for detecting micro photoelectric chips with the electronic detection module according to another embodiment of this disclosure.

FIG. 9 is a flow chart of the electronic detection method for detecting micro photoelectric chips with the electronic detection module according to another embodiment of this disclosure.

Referring to FIG. 9, the electronic detection method of this embodiment comprises the following steps S30~S36.

The step S30 is to prepare an electronic detection module 30a. In this embodiment, the electronic detection module 30a comprises any of the above-mentioned electronic detection interfaces (e.g. the electronic detection interface 10 in this embodiment), and an image detecting device 32a comprising a plurality of image detecting units 324a in a row as shown in FIG. 4A. The electronic detection module 30a is installed and electrically connected to a function analysis device 40.

The step S32 is to provide a to-be-tested wafer 70. The wafer 70 is configured with a plurality of micro photoelectric chips 72 in array, and each micro photoelectric chip 72 comprises at least one electrode 722.

The step S34 is to flip the wafer 70 on the electronic detection interface 10, so that the row of image detecting units 324a are corresponded to one row of the detection units 202 of the electronic detection interface 10 in a respect manner, and the micro photoelectric chips 72 of the wafer 70 are corresponded to the detection units 202 of the electronic detection interface 10 of the electronic detection module 30a in a respect manner.

The step S36 is to gradually attach the wafer 70 to the electronic detection interface 10 of the electronic detection module 30a until at least one electrode 722 of each of the micro semiconductor chips 72 selected as the detection base is slightly contacted or compressed against at least one resilient conductive pillar 2022 of the corresponding one of the detection units 202 so as to electrically connect to each other. At the same time, each of the image detecting units 324a of the electronic detection module 30a captures the at least one image parameter from the corresponding one of the detection units 202 of the electronic detection interface 10. Herein, a part or all of the micro photoelectric chips 72 are preselected as the detection base before the step S36, and the at least one image parameter is captured from each of the micro photoelectric chips 72.

Most of this embodiment and various modified aspects thereof can be referred to the above-mentioned electronic detection method. Different from the above-mentioned electronic detection method, in this embodiment, a plurality of image detecting units 324a in a row are functioned as the photosensitive elements, and the detection base is detected row by row, or tiny array by tiny array. Accordingly, the image parameters of the entire detection based selected by the detection units 202 of the electronic detection interface 10 can be captured.

Figure 10:
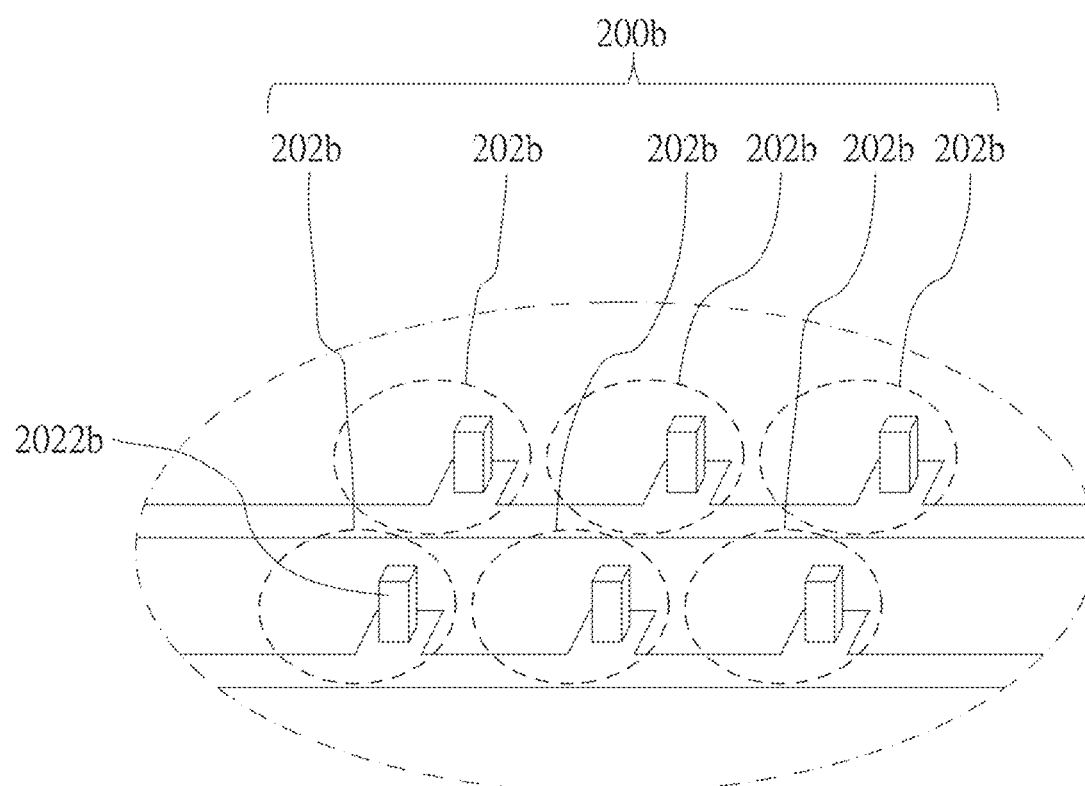
FIG. 10 is a partial schematic diagram of another embodiment of FIG. 1B.

To be noted, when the above-mentioned electronic detection interface, electronic detection module and electronic detection method are used for detecting the micro semiconductor chips/micro photoelectric chips, each chip usually comprises multiple electrodes as shown in FIGS. 8B and 8C. In addition, regarding the μLED chips with a single electrode as shown in FIGS. 6B and 6C, the corresponding detection unit 202b can be configured with a single resilient conductive pillar 2022b as shown in FIG. 10.

When the chips or chip electrodes are nanometerized and has high density development, the corresponding resilient conductive pillars are needed. The resilient conductive pillars 2022, 2022a, 2022b exemplified in the present disclosure can be miniaturized in manufacturing (referring to the width or diameter of the contact surface or the height of pillars defined hereinabove) and have the resilient property and the buffer function, so that the wafer with slight curve can still be tested. In addition, if the heights of the micro semiconductor chips/the micro photoelectric chips or the heights of the electrodes of the micro semiconductor chips/the micro photoelectric chips are varied and cannot provide a planar surface, a part or all of the resilient conductive pillars can be deformed to electrically connected with the micro semiconductor chips/the micro photoelectric chips within the detection base. Accordingly, the electronic detection interface, the electronic detection module and the electronic detection method of this disclosure can be applied to fast test the micro semiconductor chips/the micro photoelectric chips for determining the defects, thereby achieving the advantages of decreasing cost, increasing production yield, and reducing working hours.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic detection module for testing micro photoelectric chips or micro semiconductor chips, comprising:
   an electronic detection interface, comprising:
      a substrate structure including a circuit film, wherein the circuit film comprises a plurality of circuit units in array;
      a plurality of detection units in array, responsive to the micro photoelectric chips or the micro semiconductor chips, wherein the detection units are disposed on a surface of the substrate structure and are corresponded to the circuit units in a respective manner, and each of the detection units includes at least one resilient conductive pillar electrically connected to each of the circuit units through a conductive pad, wherein each of the resilient conductive pillars comprises a non-conductive photoresist and a conductive layer covering the non-conductive photoresist; and
      a plurality of image detecting units in array disposed away from the electronic detection interface with a predetermined distance, wherein the image detecting units are corresponded to the detection units of the electronic detection interface in a respect manner, and each of the image detecting units captures at least one image parameter from the corresponding one of the detection units.

2. The electronic detection module of claim 1, wherein the circuit film of the substrate structure comprises an active thin-film-transistor matrix.

3. The electronic detection module of claim 1, wherein a height of each of the resilient conductive pillars is 1-20 µm.

4. The electronic detection module of claim 1, wherein each of the resilient conductive pillars has a contact surface, and a width or a diameter of the contact surface is 0.1-20 µm.

5. An electronic detection module for testing micro photoelectric chips or micro semiconductor chips, comprising:
   an electronic detection interface, comprising:
      a substrate structure including a circuit film, wherein the circuit film comprises a plurality of circuit units in array;
      a plurality of detection units in array, responsive to the micro photoelectric chips or the micro semiconductor chips, wherein the detection units are disposed on a surface of the substrate structure and are corresponded to the circuit units in a respective manner, and each of the detection units includes at least one resilient conductive pillar electrically connected to each of the circuit units through a conductive pad, wherein each of the resilient conductive pillars comprises a non-conductive photoresist and a conductive layer covering the non-conductive photoresist; and
      a plurality of image detecting units in a row disposed away from the electronic detection interface with a predetermined distance, wherein the row of the image detecting units are corresponded to one row of the detection units of the electronic detection interface, and each of the row of the image detecting units captures at least one image parameter from the corresponding detection unit in the corresponding row.

6. The electronic detection module of claim 5, wherein the circuit film of the substrate structure comprises an active thin-film-transistor matrix.

7. The electronic detection module of claim 5, wherein a height of each of the resilient conductive pillars is 1-20 µm.

8. The electronic detection module of claim 5, wherein each of the resilient conductive pillars has a contact surface, and a width or a diameter of the contact surface is 0.1-20 µm.

* * * * *